United States Patent
Kalivas et al.

[11] Patent Number: 6,154,372
[45] Date of Patent: *Nov. 28, 2000

[54] MULTICHIP MODULE FOR SURFACE MOUNTING ON PRINTED CIRCUIT BOARDS

[75] Inventors: Vassilios Kalivas, Germering; Alois Nitsch; Heinz Peters, both of Munich, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/723,287

[22] Filed: Sep. 30, 1996

Related U.S. Application Data

[63] Continuation of application No. 08/300,313, Sep. 2, 1994, abandoned.

[30] Foreign Application Priority Data

Sep. 2, 1993 [DE] Germany ................................. 4329696

[51] Int. Cl.⁷ ............................... H05K 1/03; H05K 1/11; H05K 1/14; H01L 23/15
[52] U.S. Cl. .......................... 361/784; 361/733; 361/789; 361/790; 257/678; 257/687
[58] Field of Search .................................. 174/52.2, 52.4, 174/16.3, 252, 255, 259; 361/784–786, 790–791, 704, 707, 713, 715, 717, 718, 719, 720, 722, 733, 736, 743, 744; 257/685–686, 700, 704–706, 723–724, 787, 687, 678, 701, 703, 710, 712, 713, 717, 725, 728, 753, 758, 719; 333/246, 247

[56] References Cited

U.S. PATENT DOCUMENTS

| | | |
|---|---|---|
| 4,709,301 | 11/1987 | Yamaguti . |
| 5,045,914 | 9/1991 | Casto et al. . |
| 5,220,489 | 6/1993 | Barreto et al. . |
| 5,222,014 | 6/1993 | Lin . |
| 5,239,448 | 8/1993 | Perkins et al. . |
| 5,280,413 | 1/1994 | Pai ........................................... 361/792 |
| 5,319,243 | 6/1994 | Leicht et al. ............................. 257/723 |
| 5,355,283 | 10/1994 | Marrs et al. ............................ 174/52.4 |
| 5,552,637 | 9/1996 | Yamagata ................................ 257/717 |
| 5,666,270 | 9/1997 | Matsuda et al. ........................ 361/704 |
| 5,841,190 | 11/1998 | Noda et al. ............................. 257/678 |
| 5,847,453 | 12/1998 | Uematsu et al. ........................ 257/728 |

FOREIGN PATENT DOCUMENTS

| | | |
|---|---|---|
| 0 214 621 | 3/1987 | European Pat. Off. . |
| 0266210 | 5/1988 | European Pat. Off. . |
| 0 402 793 | 12/1990 | European Pat. Off. . |
| 0 540 247 | 5/1993 | European Pat. Off. . |
| 0642166 | 3/1995 | European Pat. Off. . |
| 2092345 | 4/1987 | Japan ...................................... 257/787 |
| 2184052 | 7/1990 | Japan ...................................... 257/724 |
| 2-210852 | 8/1990 | Japan . |
| 0022588 | 1/1991 | Japan ......................................... 29/832 |
| 4151861 | 5/1992 | Japan ...................................... 257/723 |
| 6-104379 | 4/1994 | Japan ...................................... 361/733 |
| WO 92/11654 | 7/1992 | WIPO . |

OTHER PUBLICATIONS

D.B. Whitney, "Chip–On–Board Yields Inexpensive Microcontroller", 8307 Electronic Packaging & Production 28(1988)Jun., Nr. 6, Newton, Mass., USA, pp. 80–81.

IBM Technical Disclosure Bulletin, "Module Interconnection Using Hybrid Attachment", vol. 35, No. 7, Dec. 1992, pp. 330–331.

K. Umezawa et al., "A High–Performance GaAs Multichip Package For Supercomputers", 298 NEC Reserach & Development 33(1992) Jan., No. 1, Tokyo, Japan, pp. 32–39.

*Primary Examiner*—Donald Sparks
*Attorney, Agent, or Firm*—Hill & Simpson

[57] ABSTRACT

A ceramic substrate secured with a flexible adhesive to a first side of a printed circuit board that belongs to a module and has circuit structures is provided. The ceramic substrate is contacted to the circuit structures with bond connections. The terminal elements are formed by approximately spherical accumulations of solder attached on the backside of the printed circuit board, these solder accumulations being connected to the circuit structures on the first side of the printed circuit board via through-contactings.

15 Claims, 1 Drawing Sheet

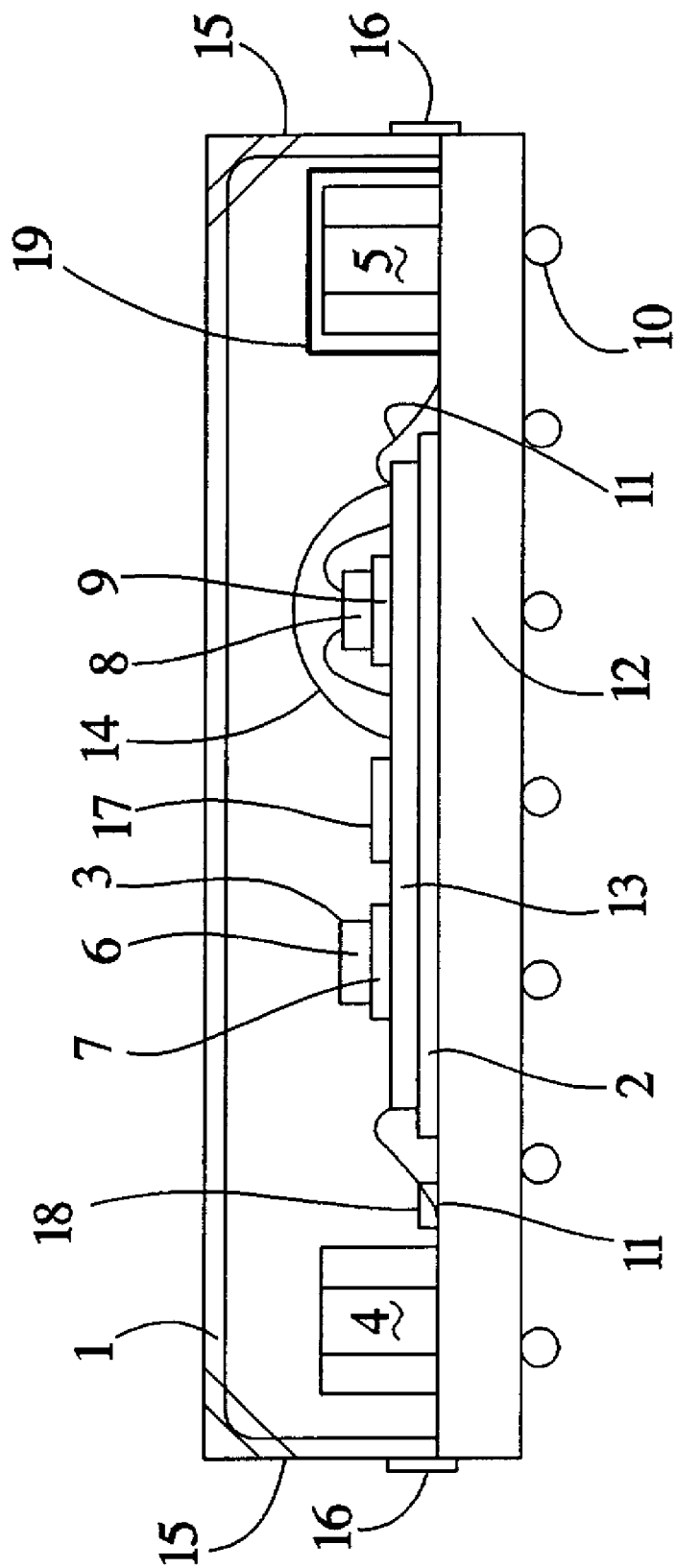

MULTICHIP MODULE FOR SURFACE MOUNTING ON PRINTED CIRCUIT BOARDS

This is a continuation of application Ser. No. 08/300,313, filed Sep. 2, 1994 now abandoned.

BACKGROUND OF THE INVENTION

1. Field of the Invention

The invention is directed generally to printed circuit boards and more specifically to a multichip module for surface mounting on printed circuit boards, having electronic components fixed on a thin-film or thick-film substrate and having SMD-compatible terminal elements.

2. Description of the Related Art

The goal of providing the entire circuitry of an electronic assembly having a plurality of ICs in a single component without the complications of providing application-tailored ICs can be currently achieved with a multichip module (MCM). With an MCM, thin-film or thick-film substrates are utilized as carriers of standard components, particularly for commercially-obtainable ICs that are connected with one-layer or multi-layer circuit structures applied on the substrate. Housed or unhoused, such MCMs should be capable of being further-processed like discrete components, i.e. capable of being integrated in other systems. Thin-film substrates are manufactured of high-quality ceramic or glass and have resistive layers, dielectric layers and interconnect layers deposited in vacuum technologies and subsequently photo-technically structured. Compared to thick-film circuits manufactured in silkscreening processes, such thin-film substrates are in fact distinguished by higher quality features (wiring density, precision and stability of the components integrated into the thin-film circuit structures), but are relatively cost-intensive dependent on the substrate area. Given the same area, the costs of a thin-film substrate are a multiple of the costs of a corresponding thick-film circuit.

In previous multichip modules provided for integration in printed circuit boards, the terminal elements are attached to the ceramic substrate. To compensate for the different thermal expansions between the substrate ceramic and the printed circuit board, terminal combs, generally standard in hybrid technology, are used. The overall area of the module, however, is enlarged as a result thereof, since the terminal combs project above the substrate surface. In addition, the number of possible terminals is too low for many applications. Moreover, the relatively cost-intensive terminal combs can be easily damaged during handling.

International application WO 92/11654 discloses bonding an individual chip to a printed circuit board instead of a ceramic lamina for cost reasons and to improve the electrical values. In view of a specific re-housing method, in particular, it is also proposed therein that the printed circuit board carrying the chip not be impressed with plug-in pins into corresponding receptacle holes of a main board as usual but that accumulations of solder capable of reflow be provided on the backside of the through-contacted carrier printed circuit board. The chip is preferably directly secured on the printed circuit board; however, it can also be fixed with a conductive adhesive. In order to resolve the problem of a different thermal expansion between a printed circuit board substrate of plastic and the silicon chip having increasing size of the discrete chip, it is also proposed to provide a metallic reinforcing layer between the conductive adhesive of the chip and the interconnects of the carrier printed circuit board. The metallic reinforcing layer reduces the mechanical pressure forces. However, multichip modules are not mentioned in the application.

SUMMARY OF THE INVENTION

It is an object of the present invention to provide an improved multichip module for surface mounting on printed circuit boards.

This object is inventively achieved in multichip module for surface mounting on a printed circuit board having electronic components fixed on a substrate selected from a group consisting of thin-film and thick-film, and having SMD-compatible terminal elements. The multichip module has a ceramic substrate secured with a flexible adhesive to a first side of a printed circuit board of the module and has a plurality of circuit structures contacted to the ceramic substrate with bond connections, and a plurality of terminal elements formed by approximately spherical accumulations of solder applied on a backside of the printed circuit board, the plurality of terminal elements being connected via through-contactings to the plurality of circuit structures on the first side of the printed circuit board.

The module of the invention is SMD (surface mounted device)-compatible particularly when using accumulations of tin solder. As an advantage, the module size is not enlarged due to the terminal elements. Since the accumulations of solder can be applied surface-wide without further ado, a high number of terminals can also be achieved. The module can be re-housed with little outlay and is thus insensitive to mechanical influences and is also suitable for the automatic equipping of the module in main printed circuit boards.

In order to reduce the area of the cost-intensive ceramic substrate to a minimum, it is advantageous to print the resistors of the module on the printed circuit board and to likewise arrange further passive components on the printed circuit board, not on the ceramic substrate.

The invention and further advantages thereof shall be set forth below with reference to an exemplary embodiment on the basis of the sole FIGURE.

BRIEF DESCRIPTION OF THE DRAWINGS

The sole FIGURE shows a schematic side sectional view of a module of the present invention.

DETAILED DESCRIPTION OF THE PREFERRED EMBODIMENTS

The module shown in the FIGURE can be soldered into a main printed circuit board 12 with solder accumulations 10, for example in a reflow furnace. In the module constructed, for example, a thin-film substrate 13 has a maximum structural height—including a protective cap 1—of approximately 5 mm and lateral dimensions of up to 32 mm×32 mm. Solder accumulations 10 applied surface-wide on the backside of the printed circuit board 12 in a rough grid of, for example, 2 mm are shown in the FIGURE. Even with a rough grid, a high number of terminals are possible. As a result, the fine pitch problems that are otherwise standard can be advantageously avoided in the present invention.

In the exemplary embodiment shown in the FIGURE, the thin-film multi-layer ceramic 13 is glued surface-wide onto the printed circuit board 12 with a layer of flexible insulating adhesive 2. This commercially obtainable, flexible insulating adhesive 2 is suitable for compensating for the mechanical stresses that occur during heating. The stresses occur to a much greater extent in a multi-chip module than in an individual chip due to the size of the multi-chip module. Apart from the poorer utilization of the area, a flexible conductive adhesive could likewise be used. The thin-film substrate 13 is electrically connected with bond connections 11 to circuit structures 18 and interconnects present on the printed circuit board 12 in a plurality of layers, including printed and balanced resistors. A passive component 4 is conductively glued onto the printed circuit board 12 outside the thin-film substrate 13, whereas a further passive component 5 is soldered onto the printed circuit board 12. All elements located on the upper side of the printed circuit board 12 are connected via the circuit structures with through-contactings (not shown in the FIGURE) that produce the connection to the solder accumulations 10 on the backside.

In order to protect the module against mechanical damage and in order to be able to automatically equip the main printed circuit board with the module, it is advantageous to cover the majority part of its upper side with the protective cap 1. This, for example, can be ceramic or plastic and can be simply glued on. However, it is also possible that the protective cap is formed by a reinforcing frame, particularly a grid-shaped reinforcing frame 15 filled with, in particular, soft gel casting compound and by a snap-on cover 16 attached thereon.

The components 6, 8 can, for example, be conductively glued 7 or glued 9 thermally conductive but in insulating fashion on the thin-film substrate 13. Even when the module is covered overall by a protective cap 1, it can be desirable in some instances to individually house components 8 arranged on the thin-film substrate 13 with an epoxy resin cover 14 or with a plastic or metal cap. In addition, the further passive component 5 has a cap 19. The cap 19 may be metal, for example. At least single-layer circuit structures, structured interconnect and resistor layers 17 are usually applied on the thin-film substrate 13. The components 6, 8 fixed on the thin-film substrate 13 are contacted to these at least single-layer circuit structures with bond connections 3. A minimization of the substrate area, i.e. a great increase in the use factor, can be achieved by limitation to a thin-film substrate 13 contacted only with bond wire techniques and on which components 6, 8 are in turn themselves contacted in space-saving fashion, i.e. unhoused if possible, by bond connections or in a flip-chip technique.

Although other modifications and changes may be suggested by those skilled in the art, it is the intention of the inventors to embody within the patent warranted hereon all changes and modifications as reasonably and properly come within the scope of their contribution to the art.

We claim:

1. A multi-chip printed circuit board module for surface mounting on a main printed circuit board having electronic components fixed on a substrate selected from a group consisting of thin-film and thick film, and having SMD-compatible terminal elements, said multichip module comprising:
   a ceramic substrate secured with a flexible adhesive to a first side of the printed circuit board module;
   a plurality of circuit structures located on said printed circuit board module and connected to said ceramic substrate with bond connections; and
   a plurality of terminal elements formed by approximately spherical accumulations of solder applied on a backside of said printed circuit board module, said plurality of terminal elements being connected via through-contactings to said plurality of circuit structures on said first side of said printed circuit board module, said plurality of terminal elements for electrically connecting the printed circuit board module to the main printed circuit board.

2. Module according to claim 1, further comprising:
   at least one discrete component fixed on and connected to said plurality of circuit structures, said plurality of circuit structures being formed by structured interconnect and resistor layers comprising at least a single layer.

3. Module according to claim 2, wherein at least one of said at least one discrete components on said printed circuit board has an epoxy resin cover.

4. Module according to claim 2, wherein at least one of said at least one discrete components on said printed circuit board has a plastic cap.

5. Module according to claim 2, wherein at least one of said at least one discrete components on said printed circuit board has a metal cap.

6. Module according to claim 1, further comprising:
   a protective cap to cover said module on said first side so that said module can be processed in an automated manner.

7. Module according to claim 6, wherein said protective cap comprises a ceramic cap glued onto said first side of said module.

8. Module according to claim 6, wherein said protective cap comprises a plastic cap glued onto said first side of said module.

9. Module according to claim 1, wherein said solder accumulations are reflow-capable tin solder material.

10. Module according to claim 1, wherein said solder accumulations are applied surface-wide in a grid on a backside of said printed circuit board.

11. Module according to claim 1, wherein said plurality of circuit structures are at least single-layer circuit structures contacted to said ceramic substrate, said components being fixed on said substrate with bond connections.

12. Module according to claim 1, wherein said plurality of circuit structures are at least single-layer circuit structures contacted to said ceramic substrate, said components being fixed on said substrate with a flip-chip technique.

13. The multi-chip printed circuit board of claim 1, wherein active components are formed on the ceramic substrate and passive components associated with the active components are secured directly to the printed circuit board.

14. Multichip module for surface mounting on a printed circuit board having electronic components fixed on a substrate selected from a group consisting of thin-film and thick film, and having SMD-compatible terminal elements, said multichip module comprising:
   a ceramic substrate secured with a flexible adhesive to a first side of a printed circuit board of said module;
   a plurality of circuit structures contacted to said ceramic substrate with bond connections;
   a plurality of terminal elements formed by approximately spherical accumulations of solder applied on a backside of said printed circuit board, said plurality of terminal elements being connected via through-contactings to said plurality of circuit structures on said first side of said printed circuit board; and
   a protective cap to cover said module on said first side so that said module can be processed in an automated manner, said protective cap having a reinforcing frame filled by soft gel casting compound and a snap-on cover attached thereon.

15. Multichip module for surface mounting on a printed circuit board having electronic components fixed on a substrate selected from a group consisting of thin-film and thick film, and having SMD-compatible terminal elements, said multichip module comprising:

a ceramic substrate secured with a flexible adhesive to a first side of a printed circuit board of said module;

a plurality of circuit structures contacted to said ceramic substrate with bond connections;

a plurality of terminal elements formed by approximately spherical accumulations of solder applied on a backside of said printed circuit board, said plurality of terminal elements being connected via through-contactings to said plurality of circuit structures on said first side of said printed circuit board; and a protective cap to cover said module on said first side so that said module can be processed in an automated manner, said protective cap having a grid-shaped reinforcing frame filled by soft gel casting compound and a snap-on cover attached thereon.

* * * * *